July 21, 1970 F. B. LOWE 3,521,194

MULTIPLE TUNNEL DIODE COAXIAL MICROWAVE OSCILLATOR

Filed June 19, 1968 2 Sheets-Sheet 1

FREDERICK B. LOWE
INVENTOR

BY William G. Christoforo
ATTORNEY

MULTIPLE TUNNEL DIODE COAXIAL MICROWAVE OSCILLATOR

Filed June 19, 1968 2 Sheets-Sheet 2

FREDERICK B. LOWE
INVENTOR

BY William G. Christoforo
ATTORNEY

United States Patent Office 3,521,194
Patented July 21, 1970

3,521,194
MULTIPLE TUNNEL DIODE COAXIAL MICROWAVE OSCILLATOR

Frederick B. Lowe, York, Pa., assignor to The Bendix Corporation, a corporation of Delaware

Filed June 19, 1968, Ser. No. 738,185
Int. Cl. H03b *7/14*
U.S. Cl. 331—101 9 Claims

ABSTRACT OF THE DISCLOSURE

A microwave oscillator wherein a plurality of tunnel diodes are coupled together to operate essentially as one oscillator so as to obtain enhanced power outputs. Each tunnel diode is biased to oscillate independently in its own cavity, the individual cavities being identical and arranged circumferentially to form the center post of a main coaxial cavity. Slots in the outer walls of the individual cavities couple energy therein into the main cavity which is excited in the $TE_{011}$ mode. A tuning ring allows the main cavity to be tuned.

BACKGROUND OF THE INVENTION

It is well known that a non-linear impedance element having a voltage-current characteristic which includes a region of negative dynamic resistance such as a tunnel diode can be made to oscillate in a cavity when properly biased at a frequency which may be locked quite easily to the frequency of another source whereby very stable oscillators can be produced. A major drawback of the tunnel diode oscillator is the very low power generating capacity of tunnel diodes operating at microwave frequencies. An obvious solution to the low power generating capacity of the single tunnel diode oscillator is to make an oscillator using large numbers of tunnel diodes. This solution, however, is not without its problems as now the impedance match of the individual tunnel diodes to the circuit becomes quite difficult as the impedance match of each diode will influence the impedance match of the other diodes in the circuit. Any mismatch will cause inefficient operation of the oscillator.

In constructing a multi-diode oscillator the diodes may be connected either in series or in parallel. Since tunnel diodes are inherently low impedance devices, tunnel diodes connected in parallel provide a circuit combination having a much lower impedance so that it becomes obvious that the matching of parallel connected diodes into a microwave oscillator can be extremely difficult. Where the diodes are serially connected the problem of impedance matching is not so acute as where parallel connected; however, other problems of mounting and tuning arise.

SUMMARY OF THE INVENTION

Accordingly, a multi-tunnel diode oscillator has been devised having a somewhat superficial appearance of a coaxial magnetron but which differs therefrom in that the main oscillator is comprised of a number of smaller individual tunnel diode oscillators consisting of tunnel diodes mounted in half-wave or quarter-wave cavities arranged coaxially in the main oscillator body. A slot which is cut in the outer wall of each individual cavity couples energy therefrom into the main oscillator cavity which is made to operate in the $TE_{011}$ mode. Current circulating around the center post must thus be constant in amplitude and phase. In this way, the individual oscillator cavities are operationally locked to one another in phase synchronism.

It is thus an object of this invention to provide a multi-diode microwave oscillator using tunnel diodes.

It is another object of this invention to provide a multi-tunnel diode microwave oscillator in which impedance matching of the individual diodes is not critical since each diode oscillates in its own cavity.

It is still another object of this invention to provide a microwave multi-tunnel diode oscillator in which the individual tunnel diodes can be conveniently biased either in parallel or in series.

Another object of this invention is to provide a multi-tunnel diode oscillator having improved frequency stability.

One more object of this invention is to provide a multi-tunnel diode oscillator having singe knob tuning capability.

DESCRIPTION OF THE PREFERRED EMBODIMENT

Figure 1:
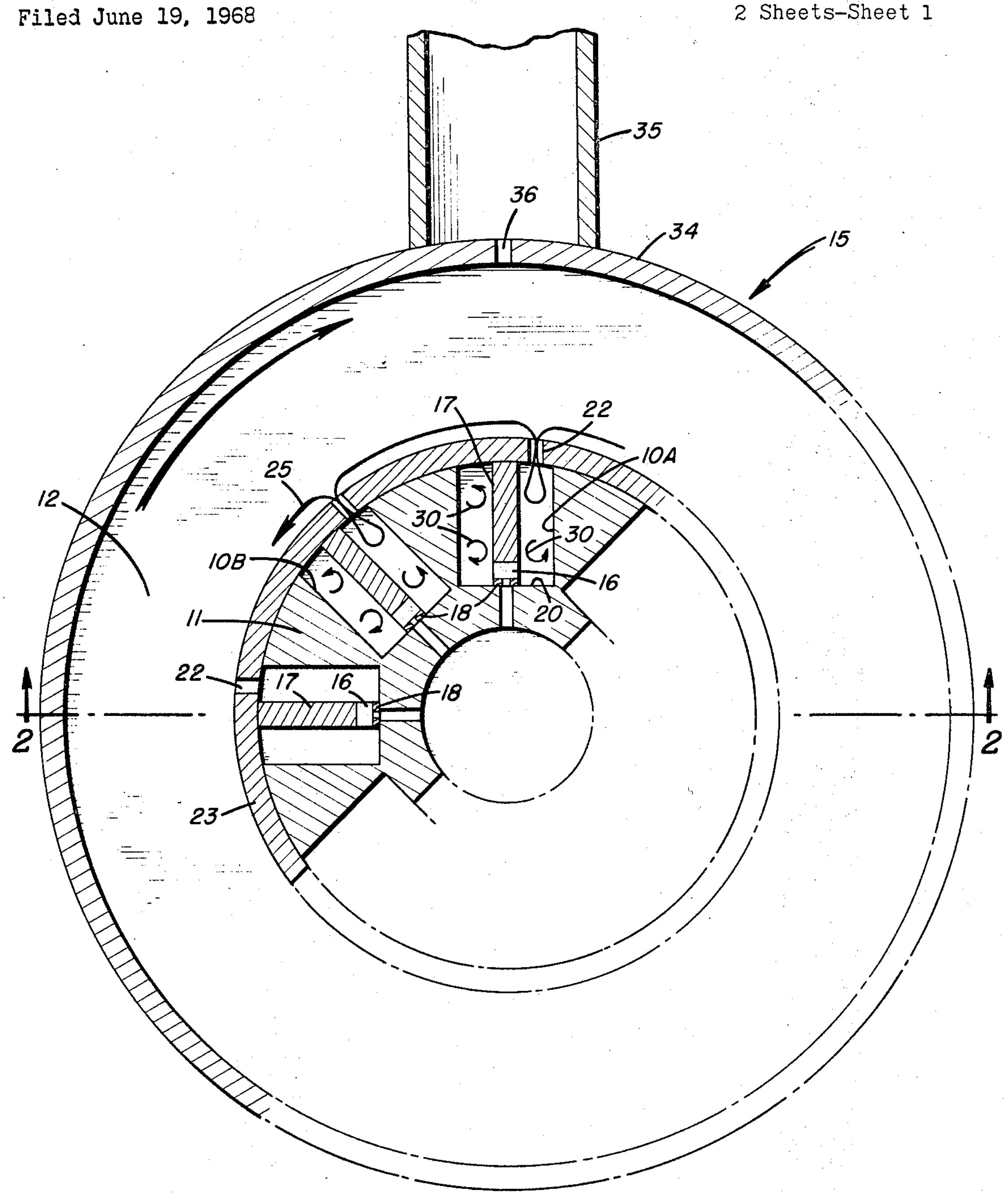
FIG. 1 is a plan sectional view taken along line 1—1 of FIG. 2 of an oscillator made in accordance with the teachings of this invention.

Referring to FIG. 1, a plurality of individual tunnel diode microwave cavities 10A, 10B, etc. are evenly distributed in a center block 11 of a larger cavity 12, thus forming the center post of the coaxial microwave oscillator 15. Each individual tunnel diode microwave cavity, for example cavity 10A, is comprised of a tunnel diode 16, a center post 17, and an insulating washer 18 which D.C. isolates tunnel diode 16 from the cavity end wall 20 for biasing purposes in a manner to be explained more fully later. An end ring 23 forms the other surface of center block 11, and hence of the main coaxial cavity center post, and the second end of individual tunnel diode cavity 10A. A slot 22 in end ring 23 allows coupling of energy from cavity 10A into main cavity 12.

Main cavity 12 is sized to resonate in the $TE_{011}$ mode at the desired frequency when so excited. Because of this, the current about the center post of the main cavity, represented by arrow 25, must have the same amplitude and phase at every point around the center conductor of the main coaxial cavity. All individual tunnel diodes and their cavities must thus oscillate in phase with the energy stored therein, as represented by current arrows 30, being coupled into the main cavity 12 through coupling slots 22. A slot 36 in outer wall 34 couples energy from main cavity 12 into waveguide 35. Other known methods of coupling energy from one region to another, such as with loops or probes, might also suitably be employed in place of the aforementioned coupling slots.

Figure 2:
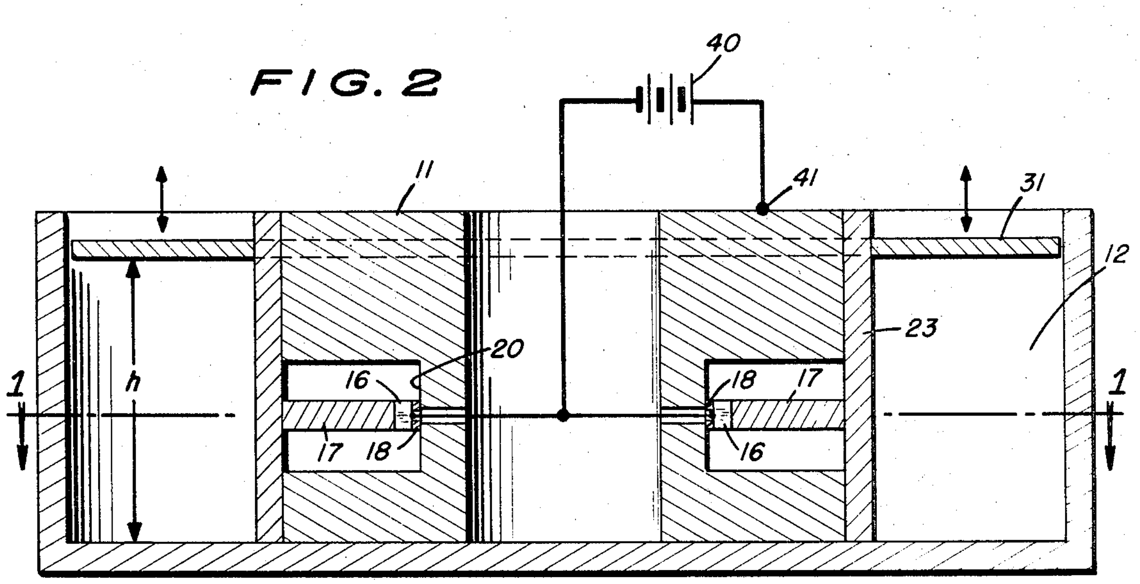
FIG. 2 is a sectional view taken along line 2—2 of FIG. 1.

Referring now to FIG. 2, section 2—2 of the microwave oscillator of FIG. 1 is seen. Tunnel diodes 16 are mounted for parallel biasing. That is, each diode is sandwiched between center post 17, which electrically connects one diode terminal to the cavity structure, and insulating washer 18, which isolates D.C. voltage on the cavity structure from the other diode terminal while bypassing R.F. current. A D.C. voltage source 40 is connected between the cavity structure at 41 and the isolated diode terminals.

Tuning of the microwave oscillator is accomplished by changing the dimensions of cavity 12 by moving tuning ring 31 in or out in the direction of the arrows as required. The tuning ring need not contact the cavity walls it being sufficient for the ring clearance to be close enough to prevent R.F. leakage from the main cavity. This, of course, produces smooth, noiseless tuning. The theoretical dimensions of cavity 12 can be computed by considering the desired oscillator frequency and by consulting one of the curves published in the literature showing the relationship between wavelength and oscillator size. One such curve appears as FIGS. 4–7 on page 71 of "Microwave Transmission Design Data" by Theodore Moreno, published by McGraw Hill, 1948. The height $h$, of the cavity is, of course, equal to one-half wavelength. As an example, for an oscillator frequency corresponding to wavelength of four inches (approximately 3 gHz.) the cavity height is two inches. From the aforementioned curve ($TE_{011}$ mode in coax) for a ratio of:

$$R=b/a=4$$

where $b$ is the radius of the main cavity outer conductor and $a$ is the radius of the main cavity center post $$\frac{\lambda c}{2b}=0.7$$

where $\lambda C$ is the cut-off wavelength. Thus, $$b=\frac{\lambda c}{2\times 0.7}=\frac{4.0}{2\times 0.7}=2.9 \text{ inches}$$

and $$a=\frac{b}{R}=\frac{2.9}{4}=0.72 \text{ inch}$$

The individual tunnel diode cavities generally oscillate in the TEM mode. However, the determination of the size of these individual cavities is not so straight-forward as the determination of the main cavity size. Basic individual cavity size is determined by considering the size cavity which will sustain the TEM mode, but this must be modified by consideration of the diode capacitance and coupling characteristics.

Other modes of oscillation which are excited in the $TE_{011}$ main cavity are damped out by suitably placed microwave absorbent material as is now common practice in the coaxial magnetron art.

Figure 3:
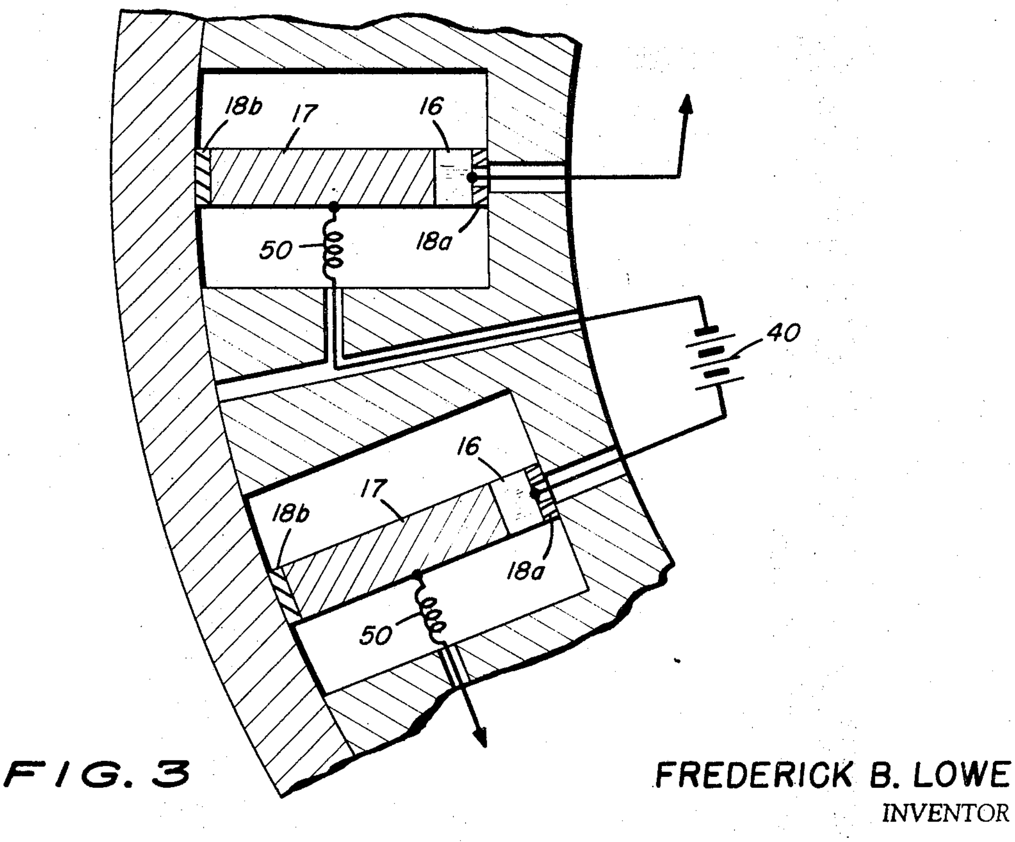
FIG. 3 is a more detailed view of the structure of the individual tunnel diode cavities.

Referring to FIG. 3, a means of serially biasing the individual tunned diodes is seen. Diode 16 and center post 17 are D.C. isolated from the cavity by insulating washers 18$a$ and 18$b$. The insulating washers, however, allow the R.F. oscillations to be bypassed. The individual diodes may now be serially connected with D.C. voltage source 40. R.F. choke 50 and the bypass capacitance between the D.C. leads and the oscillator structure prevents interaction between the individual cavities through the biasing lines.

I do not wish to limit my invention solely to the form shown herein.

The invention claimed is:

1. A coaxial microwave oscillator for generating a desired electrical frequency having a main cavity and a center post structure therein and comprising:

a plurality of individual, essentially closed, microwave cavities having a predetermined form and size arranged in said center post structure;

a plurality of non-linear impedance elements having a voltage current characteristic which includes a region of negative dynamic resistance, one such element mounted in each said individual cavity so as to generate electrical oscillations therein when biased;

means for biasing said non-linear impedance elements; and means for coupling said electrical oscillations in said individual cavities into said main cavity, the form and size of said main cavity being predetermined to excite said main cavity in the $TE_{011}$ mode of said desired frequency.

2. A coaxial microwave oscillator as recited in claim 1 wherein each of said non-linear impedance element comprises a tunnel diode.

3. A coaxial microwave oscillator as recited in claim 2 with additionally means coupling energy out of said main cavity.

4. A coaxial microwave oscillator as recited in claim 2 wherein said biasing means comprises:

a D.C. voltage source; and, means serially connecting said D.C. voltage source and said tunnel diodes including means for suppressing electrical oscillations induced on said connecting means.

5. A coaxial microwave oscillator as recited in claim 2 wherein said means coupling said electrical oscillations in said individual cavities comprises a plurality of slots, one in each individual cavity allowing communication of said individual cavity oscillations into said main cavity.

6. A coaxial microwave oscillator as recited in claim 5 wherein said individual cavities are arranged radially and equally spaced in said center post.

7. A coaxial microwave oscillator as recited in claim 2 with additionally a movable tuning ring for varying the form and size of said main cavity within predetermined limits.

8. A coaxial microwave oscillator as recited in claim 2 wherein said biasing means comprises:

a D.C. voltage source; and, means connecting said tunnel diodes in parallel across said D.C. voltage source and including means for suppressing electrical oscillations induced on said connecting means.

9. A coaxial microwave oscillator as recited in claim 2 wherein the form and shape of said individual cavities is such as to excite said individual cavities in the TEM mode of oscillation.

References Cited

UNITED STATES PATENTS

| | | |
|---|---|---|
| 3,127,574 | 3/1964 | Sommers. |
| 3,160,826 | 12/1964 | Marcatili. |
| 3,189,843 | 6/1965 | Bruck. |
| 3,378,789 | 4/1968 | Gerlach. |

ROY LAKE, Primary Examiner

S. H. GRIMM, Assistant Examiner

U.S. Cl. X.R.

331—107; 333—80, 83